(12) United States Patent
Yamada et al.

(10) Patent No.: US 6,933,590 B2
(45) Date of Patent: Aug. 23, 2005

(54) SEMICONDUCTOR DEVICE COMPRISING PLURALITY OF SEMICONDUCTOR AREAS HAVING THE SAME TOP SURFACE AND DIFFERENT FILM THICKNESSES AND MANUFACTURING METHOD FOR THE SAME

(75) Inventors: Takashi Yamada, Ebina (JP); Atsushi Azuma, Wappingers Falls, NY (US); Yoshihiro Minami, Fujisawa (JP); Hajime Nagano, Yokohama (JP); Hiroaki Yamada, Yokohama (JP); Tatsuya Ohguro, Yokohama (JP); Kenji Kojima, Yokohama (JP); Kazumi Inoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 10/653,093

(22) Filed: Sep. 3, 2003

(65) Prior Publication Data

US 2004/0113228 A1 Jun. 17, 2004

(30) Foreign Application Priority Data

Sep. 4, 2002 (JP) .................................... 2002-259193

(51) Int. Cl.$^7$ ................................................ H01L 29/06
(52) U.S. Cl. ............................... 257/653; 257/E21.013; 438/239; 438/253; 438/256; 438/395; 438/396
(58) Field of Search ................................. 438/256, 239, 438/253, 395, 396; 257/E21.013

(56) References Cited

U.S. PATENT DOCUMENTS

| 5,969,401 A | 10/1999 | Hamajima |
| 6,020,615 A | 2/2000 | Lee |
| 6,531,754 B1 | 3/2003 | Nagano et al. |
| 6,630,714 B2 | 10/2003 | Sato et al. |
| 6,635,952 B2 | 10/2003 | Inoh et al. |
| 6,743,672 B2 * | 6/2004 | Park .......................... 438/253 |

FOREIGN PATENT DOCUMENTS

| JP | 8-46031 | 2/1996 |
| JP | 11-204541 | 7/1999 |
| JP | 2000-223679 | 8/2000 |
| JP | 2002-289490 | 10/2002 |
| JP | 2003-31687 | 1/2003 |
| JP | 2003-100641 | 4/2003 |
| JP | 2003-100900 | 4/2003 |

OTHER PUBLICATIONS

H. L. Ho, et al., IEDM Technical Digest, pp. 503–506, "A 0.13 μm High–Performance SOI Logic Technology With Embedded DRAM for System–on–a–Chip Application", 2001.
Y. Yamada, et al., Symposium on VLSI Technology Digest of Technical Papers, pp. 112–113, "An Embedded DRAM Technology on SOI/Bulk Hybrid Substrate Formed With SEG Process for High–end SOC Application", 2002.
R. Hannon, et al., Symposium on VLSI Technology Digest of technical Papers, pp. 66–67, "0.25 μm Merged Bulk DRAM and SOI Logic Using Patterned SOI", 2000.

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

A convex polycrystalline silicon film is formed on a handle wafer. A semiconductor layer is formed on the polycrystalline silicon film. The semiconductor is thinner on its areas in which the convex polycrystalline silicon film is formed and is thicker on its areas in which the convex polycrystalline silicon film is not formed. An opening is formed in each of those areas of an insulating film which are located under respective thick-film semiconductor areas of the semiconductor layer. The polycrystalline silicon film is formed in the openings to connect electrically the thick-film semiconductor areas and the handle wafer together.

7 Claims, 10 Drawing Sheets

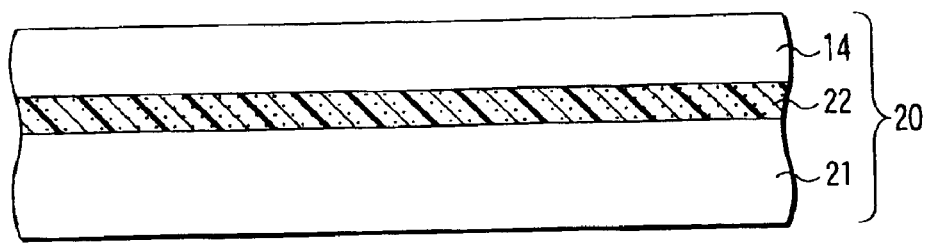
F I G. 12A
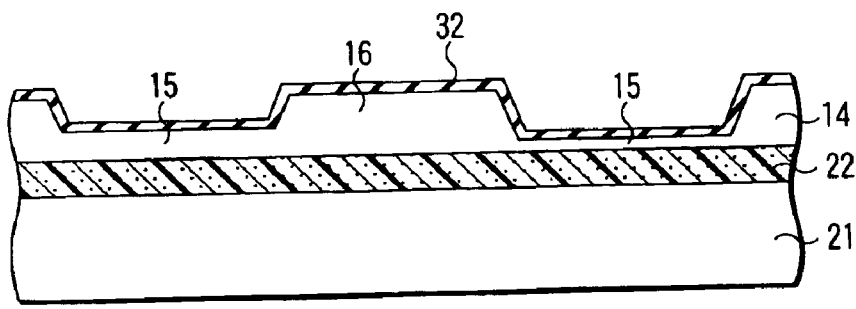
F I G. 12B
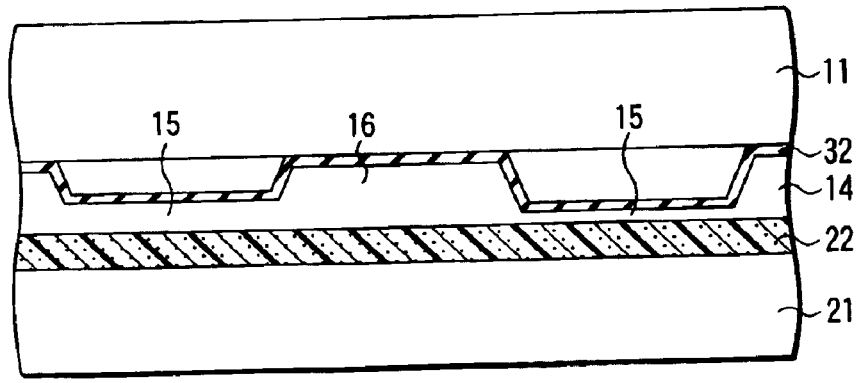
F I G. 12C
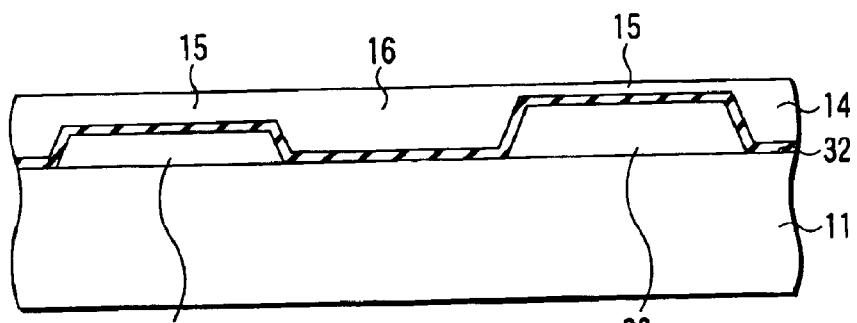
F I G. 12D

US 6,933,590 B2

SEMICONDUCTOR DEVICE COMPRISING PLURALITY OF SEMICONDUCTOR AREAS HAVING THE SAME TOP SURFACE AND DIFFERENT FILM THICKNESSES AND MANUFACTURING METHOD FOR THE SAME

CROSS-REFERENCE TO RELATED APPLICATIONS

This application is based upon and claims the benefit of priority from the prior Japanese Patent Application No. 2002-259193, filed Sep. 4, 2002, the entire contents of which are incorporated herein by reference.

BACKGROUND OF THE INVENTION

1. Field of the Invention

The present invention relates to a semiconductor device having a mixture of thin-film semiconductor areas and thick-film semiconductor areas and a manufacturing method for this semiconductor device.

2. Description of the Related Art

In recent years, there has been an increasing demand for an SoC (System on a Chip) that realizes an inexpensive and high-performance system by integrating on the same semiconductor chip a plurality of functional blocks including a high-performance digital circuit such as an MPU (Microprocessor Unit), a semiconductor memory such as a DRAM, and an analog circuit. To develop an SoC providing higher performance, it is important to deal simultaneously with differences in element structures used for the functional blocks and differences in characteristics required for the elements.

The recent technical trend, particularly in the field of digital circuits, is to use MOSFETs having finer elements and reduced parasitic capacitances that have been achieved utilizing an SOI (Silicon On Insulator) structure. It is thus necessary to provide a technique of mixing a DRAM and an analog circuit on an SOI substrate.

However, in a semiconductor memory such as a DRAM or in an analog circuit, a floating body effect of the SOI structure may cause improper circuit operations, for example, malfunctioning and the degradation of a noise characteristic. It is thus difficult to introduce the SOI structure without any modification.

Thus, a method of using a substrate having both an SOI substrate area and a bulk substrate area and forming elements of functional circuits suitable for the respective areas is described in, for example, H. L. Ho et al. at IBM Microelectronics Semiconductor Research and Development Center "A 0.13 µm High-Performance SOI Logic Technology with Embedded DRAM for System-On-Chip Application" IEDM Technical Digest pp. 503 to 506 in 2001.

The method disclosed in this document forms an SOI area by selectively forming a BOX oxide film on a bulk substrate using a SIMOX (Separation by Implanted Oxygen) method.

However, with this method, since the BOX oxide film is formed inside the substrate, a crystal defect may occur at the boundary part between each SIMOX part and a corresponding non-SIMOX part. The height of the surface of the substrate may vary between the SIMOX area and the non-SIMOX area to form steps. This may reduce the yield associated with the formation of fine patterns. Furthermore, for the film configuration of the SIMOX part, i.e. a film composed of the SOI film and the BOX oxide film, the process window is narrow which is used to suppress crystal defects and the creation of pin holes. In particular, it is difficult to form, on the same substrate, areas having different SOI film thicknesses and/or a different BOX oxide film thicknesses.

BRIEF SUMMARY OF THE INVENTION

According to an aspect of the present invention, there is provided a manufacturing method for a semiconductor device including: providing a first semiconductor substrate having a separation layer on one main surface, forming on the separation layer a semiconductor layer having concave parts and convex parts, forming a deposition film on the semiconductor layer and then flattening the deposition film, bonding a second semiconductor substrate to a surface on which the deposition film is formed, and splitting the first semiconductor substrate along the separation film.

Furthermore, according to another aspect of the present invention, there is provided a semiconductor device including a semiconductor substrate, a plurality of convex films provided at selected positions on the substrate, an insulating film provided so as to extend continuously over the plurality of convex films and a surface of the substrate, a semiconductor layer provided on the insulating film and composed of thin-film semiconductor areas located over the plurality of convex films and thick-film semiconductor areas each located between a pair of convex films and having a larger film thickness than the thin-film semiconductor areas, the semiconductor layer having a flat surface on its top surface, and a conductive layer provided in the insulating film at positions corresponding to the thick-film semiconductor areas of the semiconductor layer to connect electrically the semiconductor layer and the substrate together.

BRIEF DESCRIPTION OF THE SEVERAL VIEWS OF THE DRAWING

FIGS. 12A to 12D are sectional views showing a manufacturing method for a semiconductor device according to a sixth embodiment of the present invention in the order of steps of the method;

DETAILED DESCRIPTION OF THE INVENTION

Embodiments of the present invention will be described below in detail with reference to the drawings.
(First Embodiment)

Figure 1:
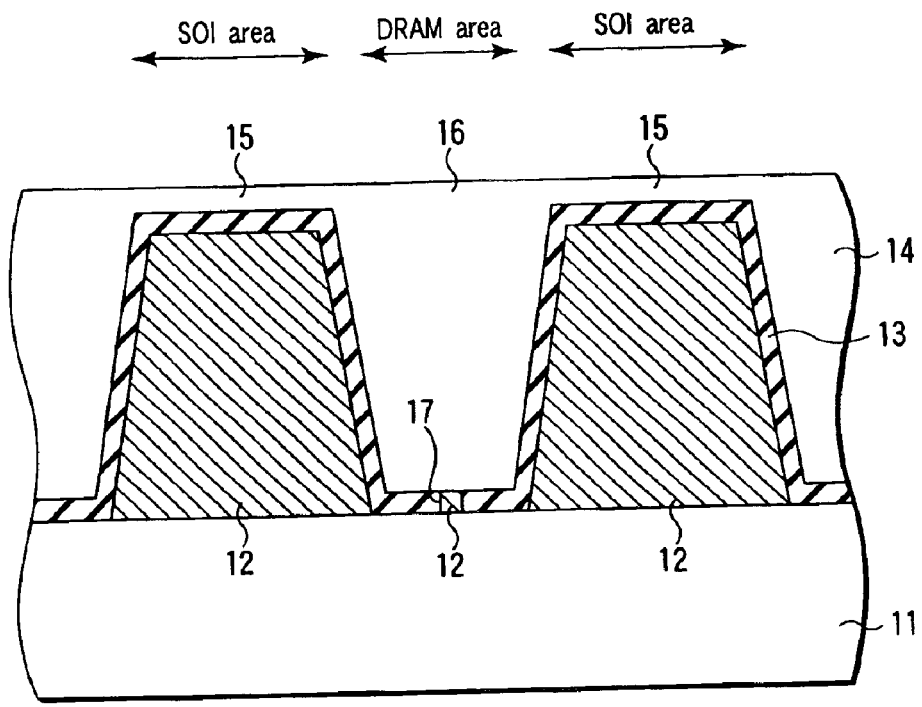
FIG. 1 is a sectional view of a semiconductor device according to a first embodiment of the present invention.

FIG. 1 is a sectional view of a semiconductor device according to a first embodiment of the present invention.

A plurality of convex polycrystalline silicon layer 12 are formed on a handle wafer 11 at selected positions, the handle wafer 11 being composed of a silicon semiconductor substrate. An insulating film 13 with a uniform thickness is continuously formed on the polycrystalline silicon layers 12 and on those part of the surface of the handle wafer 11 on which the polycrystalline silicon layer 12 is not formed. The insulating film 13 may be composed of, for example, a buried oxide (BOX) film obtained by oxidizing the entire surface in an oxidation environment. A semiconductor layer 14 composed of semiconductor silicon is formed on the insulating film 13. The semiconductor layer 14 may be formed by, for example, an epitaxial growth method and has a flat top surface.

In this case, the semiconductor layer 14 has a small film thickness of, for example, about 50 nm on each area in which the convex polycrystalline silicon layer 12 is formed. In these areas, the semiconductor layer 14 constitutes a thin-film semiconductor area 15 and is used as an SOI area. On the other hand, the semiconductor layer 14 has a large film thickness of, for example, about 10 µm on each area in which the convex polycrystalline silicon layer 12 is not formed. In this areas, the semiconductor layer 14 constitutes a thick-film semiconductor area 16 and may be used as a DRAM area in order to form a DRAM memory cell having a trench capacitor.

Further, an opening 17 is formed in that part of the insulating film 13 which is located under each thick-film semiconductor area 16 of the semiconductor layer 14. The polycrystalline silicon layer 12 is formed in this opening 17 to connect electrically the corresponding thick-film semiconductor area 16 and the handle wafer 11 together via this polycrystalline silicon layer 12 inside the opening 17.

Description will be given of a manufacturing method for a semiconductor device having such a configuration as shown in FIG. 1.

Figure 2A:
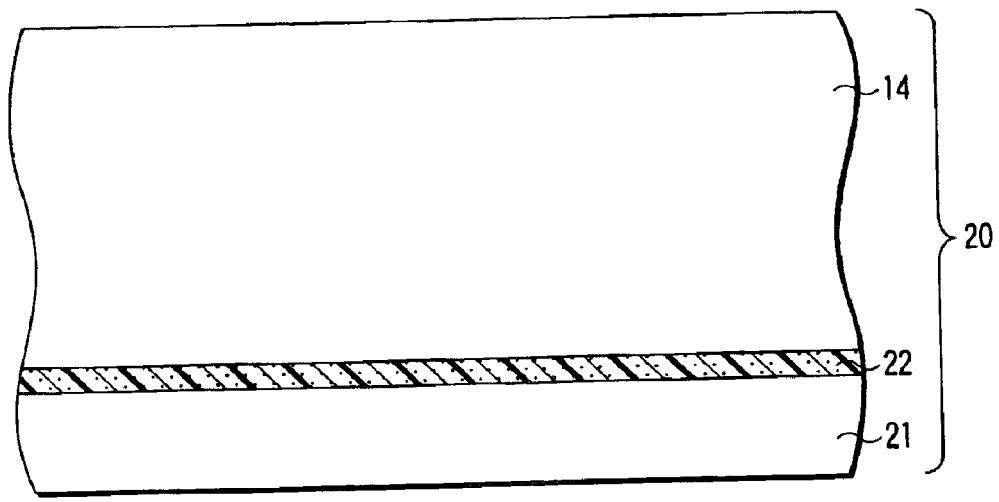
FIGS. 2A to 2E are sectional views showing a manufacturing method for the semiconductor device in FIG. 1 in the order of steps of the method.

First, an SOI wafer 20 is provided which has such a configuration as shown in FIG. 2A. The SOI wafer 20 is configured so that a separation layer 22 and a semiconductor layer 14 with a uniform thickness are stacked on a seed wafer 21 composed of a silicon semiconductor substrate.

The SOI wafer 20 may be formed using a generally well known ELTRAN (Epitaxial Layer Transfer) or UNIBOND technique. For example, with the ELTRAN technique, the SOI wafer 20 is obtained by forming the porous separation film 22 on a surface of the seed wafer 21 by anodizing technique and then forming the semiconductor layer 14 by the epitaxial growth method.

On the other hand, with the UNIBOND technique, the SOI wafer 20 is obtained by injecting hydrogen ions onto the surface of the seed wafer 21 to form the separation layer and then forming the semiconductor layer 14 by the epitaxial growth method.

Figure 2B:
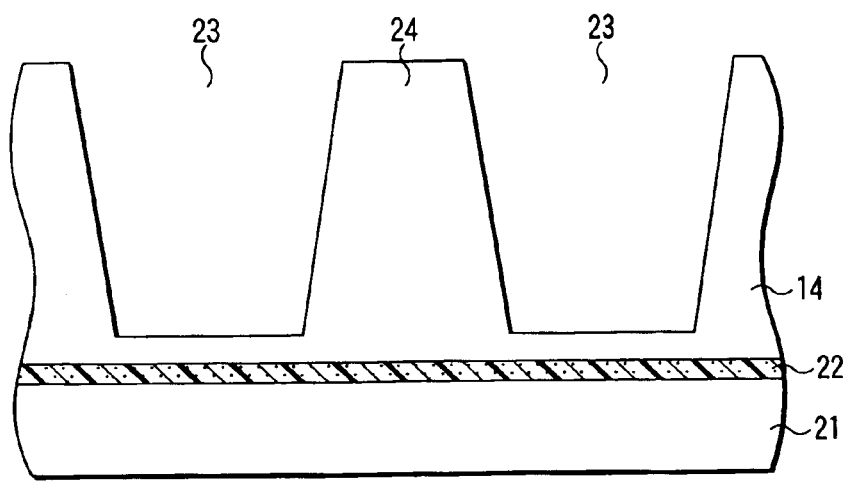

Then, as shown in FIG. 2B, an etching-resistant mask material having a predetermined pattern is formed on the surface of the semiconductor layer 14. Subsequently, the semiconductor layer 14 is selectively etched to form a plurality of concave parts 23 and convex parts 24 on this layer 14.

Figure 2C:
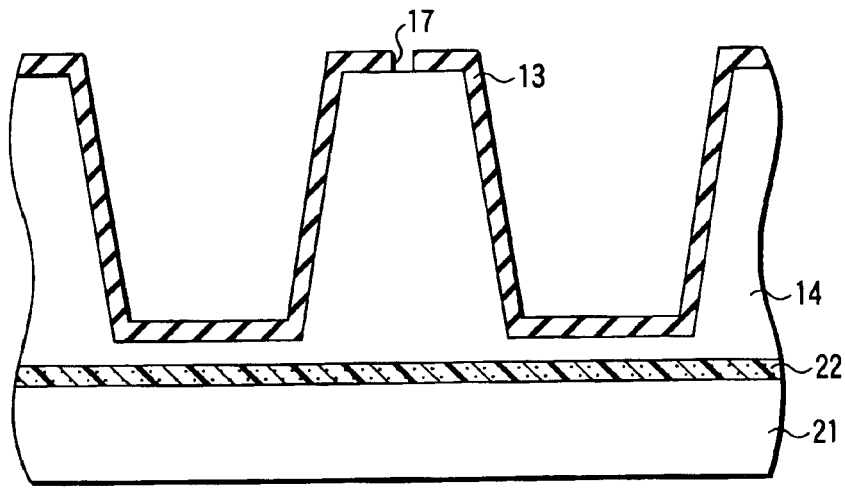

Then, as shown in FIG. 2C, the resulting structure is oxidized in an oxidation atmosphere to form the insulating film 13 with a uniform thickness on the surface of the semiconductor layer 14. Subsequently, openings 17 are formed at positions corresponding to the respective convex parts 24 of the semiconductor layer 14.

Figure 2D:
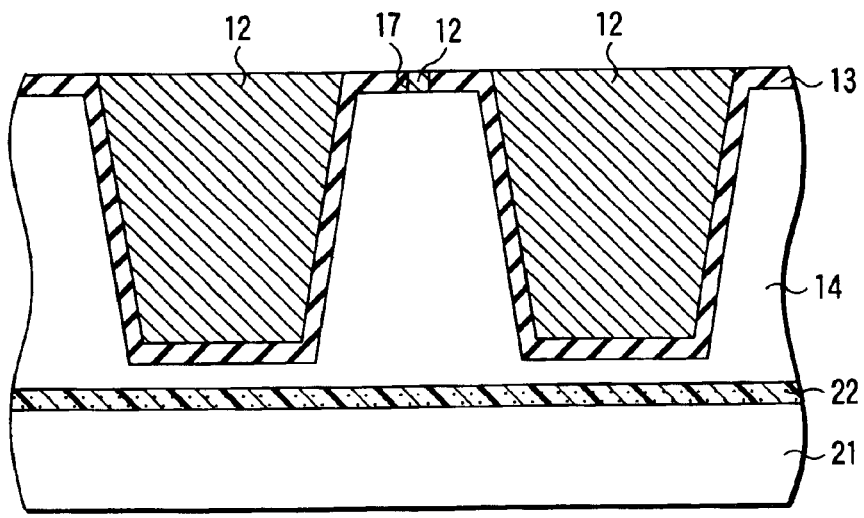

Subsequently, the polycrystalline silicon layer 12 is deposited all over the top surface of the resulting structure. Then, a CMP (Chemical Mechanical Polishing) technique is used to flatten the surface to leave the polycrystalline silicon layer 12 in the concave parts 23 of the semiconductor layer 14 and in the openings 17 of the insulating film 13 as shown in FIG. 2D. The polycrystalline silicon layer 12 may have its resistance reduced by introducing impurities into this layer beforehand or by depositing the layer 12 without impurities and then introducing impurities into it.

Figure 2E:
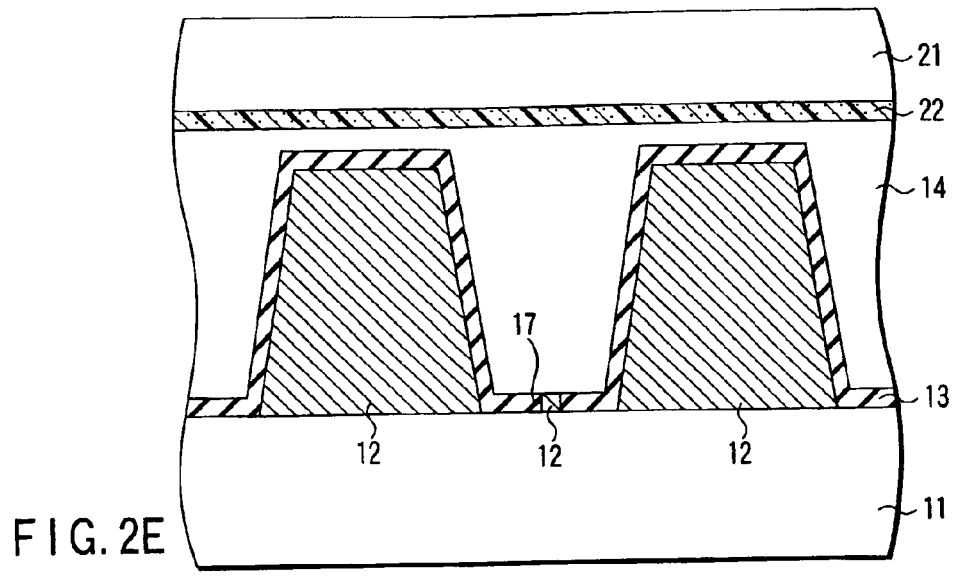

Then, as shown in FIG. 2E, the handle wafer 11, composed of a silicon semiconductor substrate, is bonded to the surface on which the polycrystalline silicon layer 12 is formed. Subsequently, the separation layer 22 is destroyed by a water jet technique if the SOI wafer 20 has been formed by the ELTRAN technique or by a smart cut method (R) if the SOI wafer 20 has been formed by a UNIBOND technique. Thus, the seed wafer 21 is split and the split surface is treated to obtain such a structure as shown in FIG. 1.

According to this embodiment, the thin-film semiconductor area 15 and thick-film semiconductor area 16, which have different film thicknesses, can be formed in the semiconductor layer 14. Further, the top surface of the semiconductor layer 14 is flat. Accordingly, when elements are subsequently formed in the thin-film semiconductor areas 15 and the thick-film semiconductor areas 16, no steps are present on the surface of the substrate. This prevents a decrease in the yield associated with the formation of fine patterns as occurs in the prior art.

Further, since no BOX oxide films need to be formed inside the substrate, no crystal defects occur at the boundary parts between the respective thin-film semiconductor areas 15 and the corresponding thick-film semiconductor areas 16.

Furthermore, each thick-film semiconductor area 16 is electrically connected to the handle wafer 11 via the polycrystalline silicon layer 12 provided in the corresponding opening 17. Thus, the potential in each thick-film semiconductor area 16 in which a DRAM memory cell is formed is fixed by the potential of the handle wafer 11. This prevents improper circuit operations, for example, malfunctioning and the degradation of the noise characteristic.

In the description of the above embodiment, the semiconductor layer 14 is selectively etched in order to form the concave parts 23 and the convex parts 24 in the semiconductor layer 14. However, the thick-film semiconductor areas 16 may be formed by forming the semiconductor layer 14 on the separation layer 22, the semiconductor layer 14 having a thickness corresponding to the thin-film semiconductor areas 15, and then selectively growing the semiconductor layer 14 by a selective epitaxial growth method. In this case, the epitaxial growth is conditioned so that the selectively grown semiconductor layer 14 partly rests on a mask pattern. Further, if the mask pattern remains intact, it constitutes the insulating film 13 in the SOI areas.

(Second Embodiment)

Now, with reference to FIGS. 3A to 3E, description will be given of a manufacturing method for a semi-conductor device according to a second embodiment.

Figure 3A:
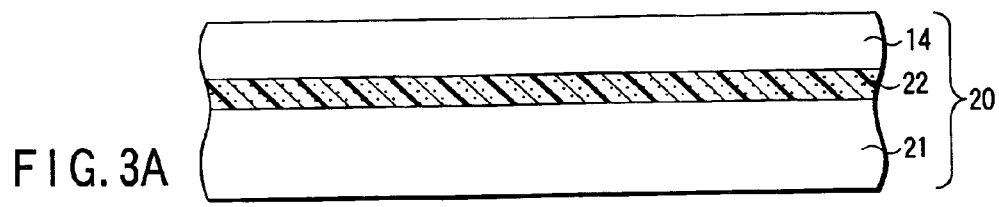
FIGS. 3A to 3E are sectional views showing a manufacturing method for a semiconductor device according to a second embodiment in the order of steps of the method.

First, as shown in FIG. 3A, the SOI wafer 20 is provided which has the separation layer 22 and the semiconductor layer 14 with a uniform thickness both stacked on the seed wafer 21, composed of a silicon semiconductor substrate. The production method for the SOI wafer 20 has already been described. Accordingly, its description is omitted here.

Figure 3B:
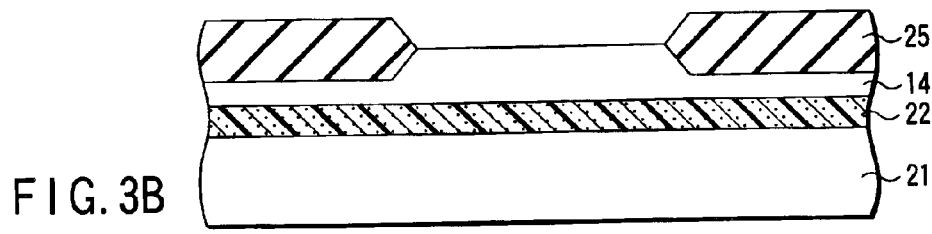

Then, as shown in FIG. 3B, an oxidation mask having a predetermined pattern is formed on the semiconductor layer 14. The wafer is then thermally oxidized in an oxidation atmosphere to form an oxide film 25 on the semiconductor layer 14.

Figure 3C:
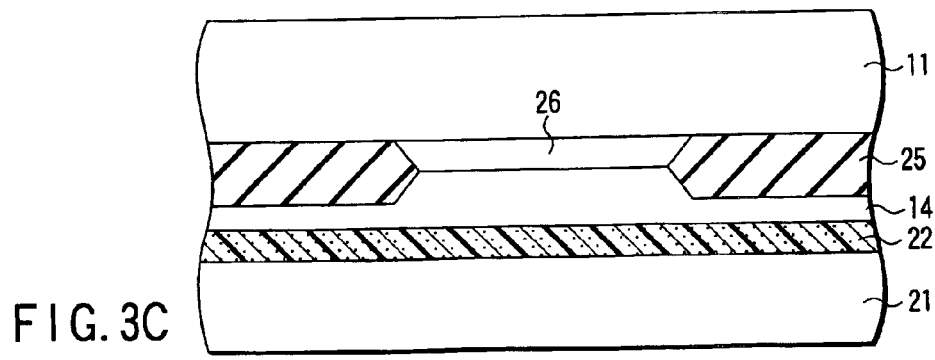

Then, as shown in FIG. 3C, the handle wafer 11, composed of a silicon semiconductor substrate, is bonded to the surface on which the oxide film 25 is formed. After the handle wafer 11 has been bonded, a cavity 26 is created in the area between the semi-conductor layer 14 and the handle wafer 11 where the oxide film 25 is not formed.

Figure 3D:
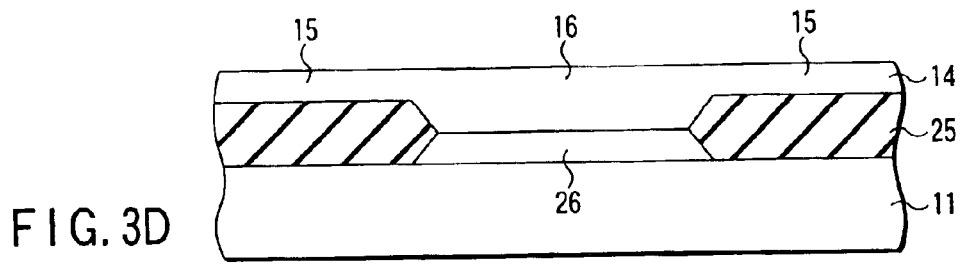

Subsequently, the separation layer 22 is destroyed by the water jet technique if the SOI wafer 20 has been formed by the ELTRAN technique or by the smart cut method if the SOI wafer 20 has been formed by the UNIBOND technique. Thus, the seed wafer 21 is split to obtain such a structure as shown in FIG. 3D.

In this case, the semiconductor layer 14 on each area in which the oxide film 25 is formed has its thickness reduced compared to its original state because silicon is incorporated into the oxide film 25. Accordingly, the semiconductor layer 14 in this area constitutes the thin-film semiconductor area 15. The oxide film 25 is formed under the thin-film semiconductor area 15, which thus constitutes the SOI area. This enables the formation of a digital circuit composed of a thin-film SOI-MOSFET.

On the other hand, the semiconductor layer 14 on each area in which the oxide film 25 is not formed maintains its original thickness. Accordingly, the semiconductor layer 14 on this area constitutes the thick-film semiconductor area 16. The cavity 26 is present under the thick-film semiconductor area 16, which thus constitutes an SON (Silicon On Nothing) area. This enables the formation of an analog circuit composed of a MOSFET of a bulk structure to which a substrate potential is reliably provided.

The method according to this embodiment is preferable if the thin-film semiconductor area 15 is larger than the thick-film semiconductor area 16 in area. Specifically, the oxide film 25 is larger than each exposed surface of the semiconductor layer 14 in area. Consequently, a high adhesive strength can be obtained by bonding the oxide films 25, which are large in area, to the handle wafer 11.

According to this embodiment, the thin-film semiconductor area 15 and thick-film semiconductor area 16, which have different film thicknesses, can be formed in the semiconductor layer 14. Further, the top surface of the semiconductor layer 14 is flat. Accordingly, when elements are subsequently formed in the thin-film semiconductor areas 15 and the thick-film semiconductor areas 16, no steps are present on the surface of the substrate. This prevents a decrease in the yield associated with the formation of fine patterns as occurs in the prior art.

Further, since no BOX oxide films need to be formed inside the substrate, no crystal defects occur at the boundary parts between the respective thin-film semiconductor areas 15 and the corresponding thick-film semiconductor areas 16.

Figure 3E:
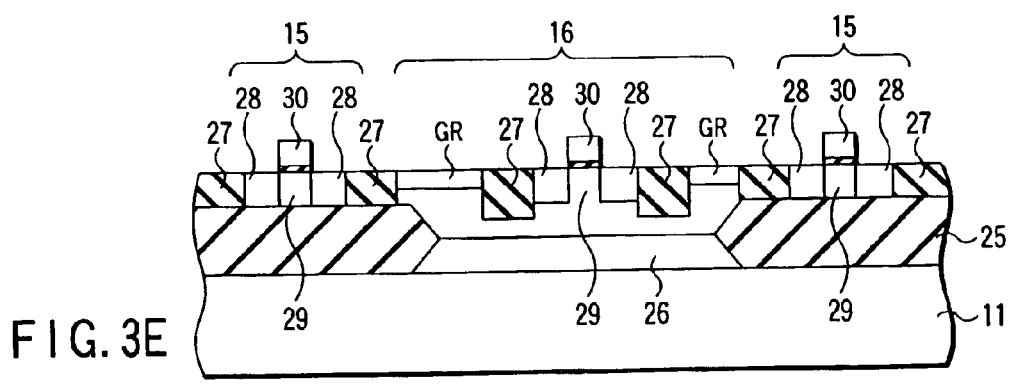

FIG. 3E shows that MOSFETs have been formed in the thin-film semiconductor areas 14 and thick-film semiconductor areas 15, respectively, of the semiconductor area 14 shown in FIG. 3D.

Each thin-film semiconductor area 15 has an element separated from the surroundings by isolation regions 27 composed of insulating films or the like and formed so that their bottom reaches the oxide film 25. Source/drain areas 28 and a channel area 29 of a MOSFET are formed in each element area. A gate electrode 30 of the MOSFET is formed on the channel area 29.

Each thick-film semiconductor area 16 also has an element separated from the surroundings by the isolation regions 27. The source/drain areas 28 and the channel area 29 of a MOSFET are formed in each element area. The gate electrode 30 of the MOSFET is formed on the channel area 29. Further, a guard ring GR is formed around the periphery of the MOSFET formed in the thick-film semiconductor area 16. A predetermined potential is applied to the guard ring GR. Typically, impurities are introduced into the guard ring GR, the impurities having the same conductive type as that of impurities introduced into the thick-film semiconductor area 16.

This embodiment can produce effects similar to those of the first embodiment. Further, since the cavity 26 is present under each thick-film semiconductor area 16, it is possible to reduce high-frequency noise that may be propagated between the MOSFET formed in the thick-film semiconductor area 16 and a MOSFET formed in another area.

In this embodiment, an oxide film or the like may be formed on the bonded surface of the handle wafer 11 or no surface films may be formed on it.

Now, description will be given of several variations of the second embodiment.

First, with reference to FIGS. 4A and 4B, description will be given of a manufacturing method for a semiconductor device according to a first variation. In FIG. 3C, the bonded surface of the handle wafer 11 is flat which is bonded to the surface on which the oxide film 25 is formed.

Figure 4A:
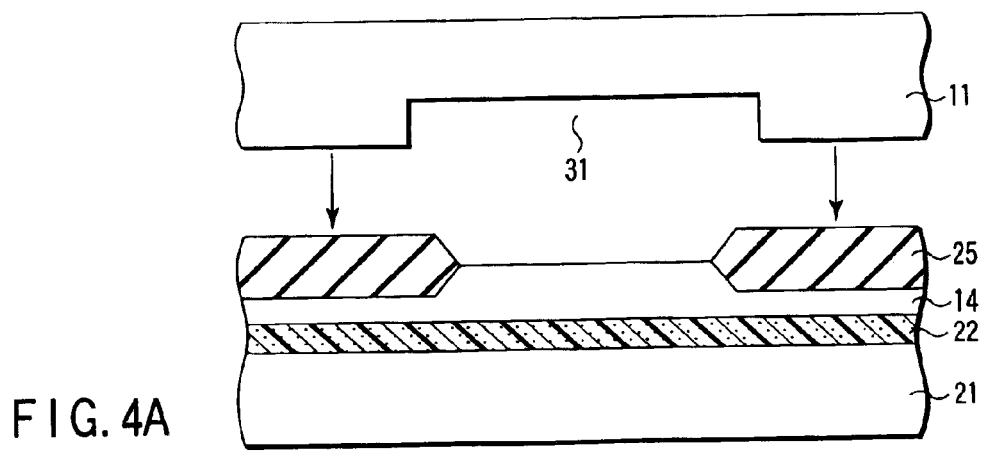
FIGS. 4A and 4B are sectional views showing some steps of a manufacturing method for a semiconductor device according to a first variation of the second embodiment.

On the other hand, this variation differs from the above second embodiment in that on the bonded surface of the handle wafer 11, a concave part 31 is already formed at a position corresponding to the area in which the oxide film 25 is not formed, as shown in FIG. 4A.

Figure 4B:
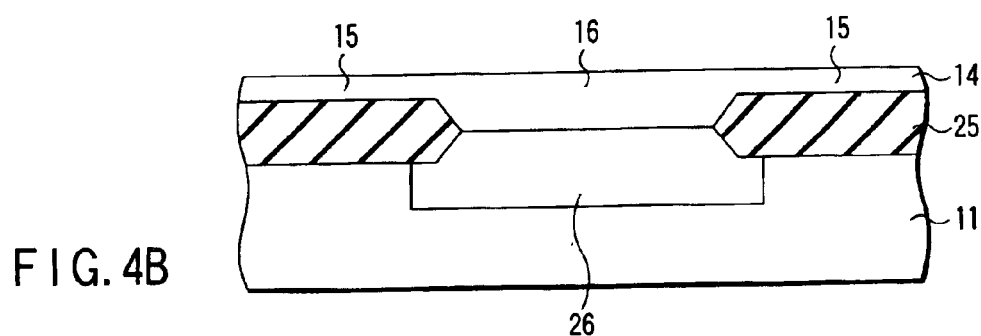

After the handle wafer 11 has been bonded to the surface on which the oxide film 25 is formed, the separation layer 22 is destroyed to split the seed wafer 21 to obtain such a structure as shown in FIG. 4B, as described previously.

According to the first variation, by adjusting the depth of the concave part 31 formed in the bonded surface of the handle wafer 11, it is possible to control stably the depth of the cavity 26, formed between the handle wafer 11 and the thick-film semiconductor area 16 after bonding. This effectively reduces possible high-frequency noise.

Furthermore, if an inductor element is formed on the thick-film semiconductor area 16, the quality factor (Q) of the inductor element can be improved.

Moreover, the concave part 31, formed in the handle wafer 11, enables the prevention of partial missing of the cavity caused by a slight distortion that may occur during a bonding operation or an element forming process.

Figure 5A:
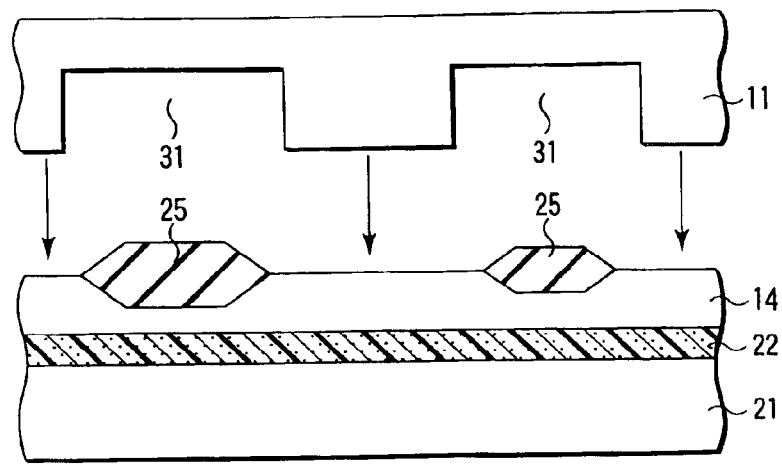
FIGS. 5A and 5B are sectional views showing some steps of a manufacturing method for a semiconductor device according to a second variation of the second embodiment.

Now, with reference to FIGS. 5A and 5B, description will be given of a manufacturing method for a semiconductor device according to a second variation. In the description of the above first variation, the concave part 31 is already formed in the bonded surface of the handle wafer 11 at the position corresponding to the area in which the oxide film 25 is not formed. In contrast, in the second variation, the concave parts 31 are already formed in the bonded surface of the handle wafer 11 at the positions corresponding to the areas in which the oxide film 25 is formed as shown in FIG. 5A.

Figure 5B:
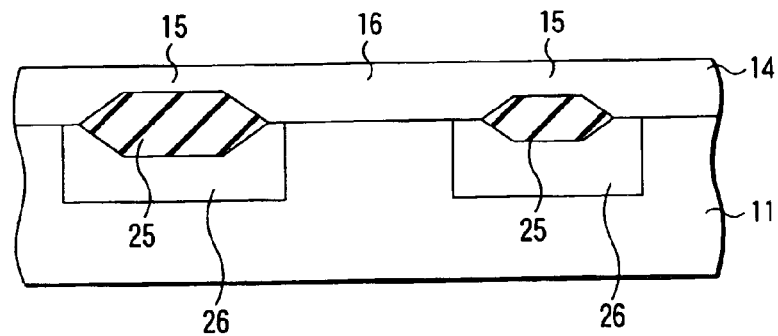

After the handle wafer 11 has been bonded to the surface on which the oxide film 25 is formed, the separation layer 22 is destroyed to split the seed wafer 21 to obtain such a structure as shown in FIG. 5B, as described previously.

The method according to the second variation is preferable if the thick-film semiconductor area 16 is larger than the thin-film semiconductor area 15 in area. Specifically, each exposed surface of the semiconductor layer 14 is larger than the oxide film 25 in area. Consequently, a high adhesive strength can be obtained by bonding the exposed surfaces of the semi-conductor layer 14, which are large in area, to the handle wafer 11.

In the second variation, the cavity 26 is formed under each thin-film semiconductor area 15. This effectively reduces high-frequency noise from the element formed in the thin-film semiconductor area 15.

Further, the method according to the second variation is also characterized in that the oxide films 25, formed in the semiconductor layer 14, include a plurality of oxide films having different thicknesses. FIGS. 5A and 5B show that two types of oxide films 25 having different thicknesses are formed. When the oxide films 25 have different thicknesses, the thin-film semiconductor areas 15 located at the positions corresponding to the oxide films 25 of the respective thicknesses also have different thicknesses.

That is, the second variation makes it possible to form a plurality of thin-film semiconductor areas 15 of different thicknesses. It is thus possible to mount a mixture of elements having SOI areas with different film thicknesses.

Figure 6:
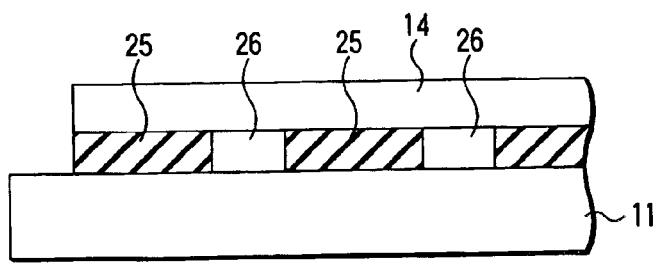
FIG. 6 is a sectional view showing some steps of a manufacturing method for a semiconductor device according to a third variation of the second embodiment.
Figure 7:
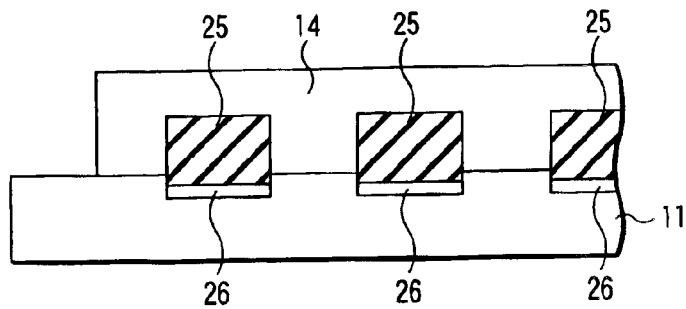
FIG. 7 is a sectional view showing some steps of a manufacturing method for a semiconductor device according to a fourth variation of the second embodiment.

If the handle wafer 11 is bonded to the oxide film 25 as in the case with the second embodiment and its first variation, the adhesive strength may decrease markedly if the cavity 26 is located in the outermost periphery of the bonded area. Thus, in a third variation, when the handle wafer 11 is bonded to the oxide films 25, the bonding operation is performed so that the oxide film 25 is located in the outermost periphery of the bonded area as shown in FIG. 6. In the outer periphery of the bonded area, the area in which the oxide film 25 is formed has only to extend, for example, about 5 mm from the outermost periphery.

In contrast, if the handle wafer 11 is bonded to the exposed surfaces of the semiconductor layer 14 as in the case with the second variation of the second embodiment, the adhesive strength may decrease markedly if the oxide film 25 is located in the outermost periphery of the bonded area. Thus, in a fourth variation, when the handle wafer 11 is bonded to the exposed surfaces of the semiconductor layer 14, the bonding operation is performed so that the exposed surface of the semiconductor layer 14 is located in the outermost periphery of the bonded area. In the outer periphery of the bonded area, the area of the exposed surface of the semiconductor layer 14 has only to extend, for example, about 5 mm from the outermost periphery.

(Third Embodiment)

Now, with reference to FIGS. 8A to 8D, description will be given of a manufacturing method for a semi-conductor device according to a third embodiment.

Figure 8A:
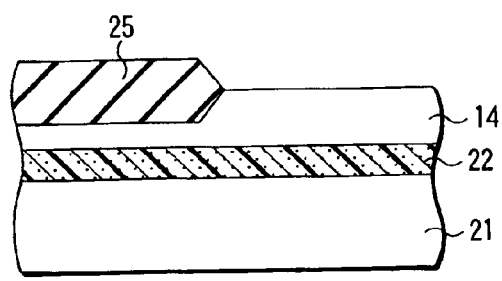
FIGS. 8A to 8D are sectional views showing a manufacturing method for a semiconductor device according to a third embodiment in the order of steps of the method.

First, as shown in FIG. 8A, the SOI wafer 20 is provided which has the separation layer 22 and the semiconductor layer 14 with a uniform thickness both stacked on the seed wafer 21, composed of a silicon semiconductor substrate. The production method for the SOI wafer 20 has already been described. Accordingly, its description is omitted here. Then, an oxidation mask having a predetermined pattern is formed on the semiconductor layer 14. The wafer is then thermally oxidized in an oxidation atmosphere to form the oxide film 25 on the semiconductor layer 14.

Figure 8B:
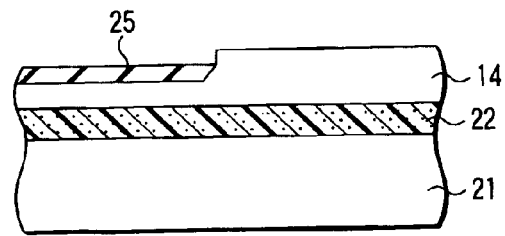

Then, a wet etching method is used to remove the top surface of the oxide film 25 so that the removed top surface of the oxide film 25 is lower than the surface of the semiconductor layer 14 as shown in FIG. 8B.

Figure 8C:
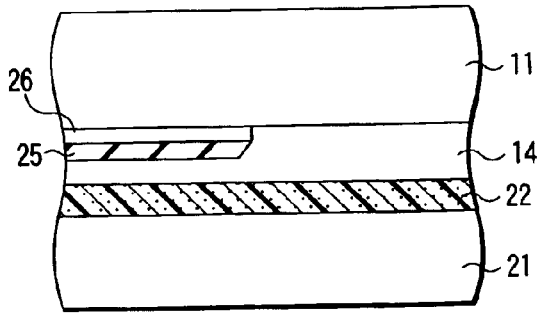
Figure 9D:
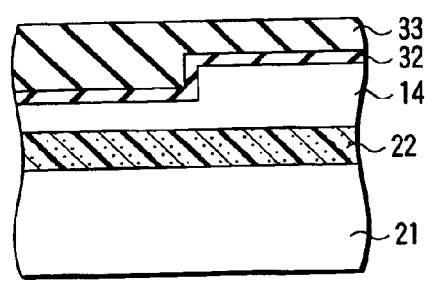

Subsequently, as shown in FIG. 8C, the handle wafer 11, composed of a silicon semiconductor substrate, is bonded to the surface on which the oxide film 25 is formed.

Figure 8D:
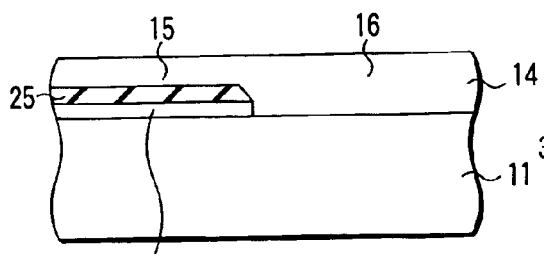
Figure 9E:
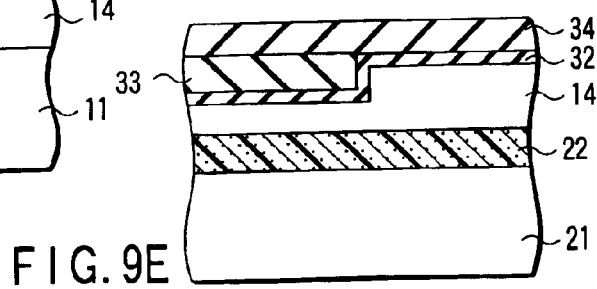

Subsequently, the separation layer 22 is destroyed by the water jet technique if the SOI wafer has been formed by the ELTRAN technique or by the smart cut method if the SOI wafer has been formed by the UNIBOND technique. Thus, the seed wafer 21 is split to obtain such a structure as shown in FIG. 8D.

In this case, that part of the semiconductor layer 14 which correspond to the area in which the oxide film 25 is formed has its thickness reduced compared to its original state because silicon is incorporated into the oxide film 25. Accordingly, the semiconductor layer 14 in this area constitutes the thin-film semiconductor area 15. Furthermore, the oxide film 25 and the cavity 26 are formed under the thin-film semiconductor area 15, which thus constitutes the SOI and SON areas. This enables the formation of a digital circuit composed of a thin-film SOI-MOSFET.

On the other hand, the semiconductor layer 14 located on the area in which the oxide film 25 is not formed maintains its original thickness. Accordingly, the semiconductor layer 14 on this area constitutes the thick-film semiconductor area 16. The thick-film semiconductor area 16 can be formed with an analog circuit composed of a MOSFET of a bulk structure to which a substrate potential is reliably provided.

Also according to this embodiment, the thin-film semiconductor area 15 and thick-film semiconductor area 16, which have different film thicknesses, can be formed in the semiconductor layer 14. Further, the top surface of the semiconductor layer 14 is flat. Accordingly, when elements are subsequently formed in the thin-film semiconductor areas 15 and the thick-film semiconductor areas 16, no steps are present on the surface of the substrate. This prevents a decrease in the yield associated with the formation of fine patterns as occurs in the prior art.

Further, since no BOX oxide films need to be formed inside the substrate, no crystal defects occur at the boundary parts between the respective thin-film semiconductor areas 15 and the corresponding thick-film semiconductor areas 16.

(Fourth Embodiment)

It is assumed that the thin-film semiconductor areas 15 and the thick-film semiconductor areas 16 are obtained by forming concave and convex parts on the surface of the semiconductor layer 14 formed on the SOI wafer 20 as described previously. Then, the surface bonded to the handle wafer 11 is provided with concave and convex parts if no films are formed on the concave parts in the surface of the semiconductor layer 14.

In general, when a wafer having a pattern with concave and convex parts is bonded to another, the adhesive strength must be maintained only by the convex parts. Accordingly, this method is unsuitable for a small chip in which the percentage of the area of the entire chip taken up by the area of the convex parts is small.

Thus, in the method according to a fourth embodiment, after the surface of the semiconductor layer 14 with the concave and convex parts has been flattened, it is bonded to the handle wafer 11 to provide a sufficient adhesive strength.

This method will be described in detail with reference to FIGS. 9A to 9D.

Figure 9A:
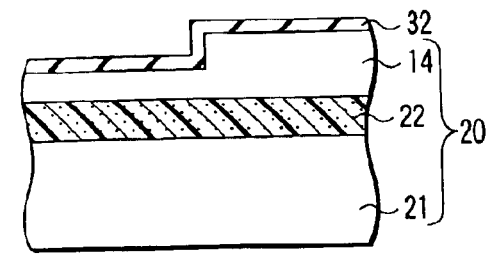
FIGS. 9A to 9E are sectional views showing a manufacturing method for a semiconductor device according to a fourth embodiment in the order of steps of the method.

First, as shown in FIG. 9A, the SOI wafer 20 is provided which has the separation layer 22 and the semiconductor layer 14 with a uniform thickness both stacked on the seed wafer 21, composed of a silicon semiconductor substrate. Subsequently, the semi-conductor layer 14 is processed to form concave and convex parts on its surface. For this processing, the semiconductor layer 14 may be formed so as to have a uniform film thickness and then selectively etched so as to be partly formed with convex parts as described previously. Alternatively, the semiconductor layer 14 may be formed so as to have a uniform film thickness and then selectively epitaxially grown so as to be partly formed with convex parts. Subsequently, the surface is oxidized to form an insulating film 32.

Figure 9B:
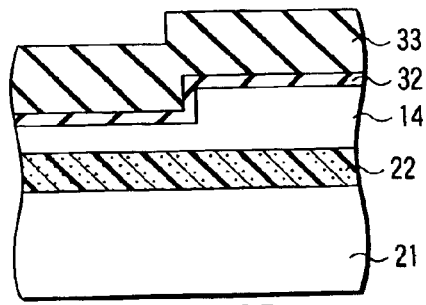

Then, as shown in FIG. 9B, a deposition film composed of an arbitrary film, e.g. polycrystalline silicon, amorphous Si, a silicon oxide film ($SiO_2$), or a silicon nitride film (SiN) is formed all over the top surface of the resulting structure. Alternatively, a fluid film may be used in place of the deposition film 33. In this case, the deposition film 33 is preferably composed of a material having nature similar to that of the underlying insulating film 32. For example, if the insulating film 32 is a thermal oxide film, a CVD oxide film may be used as a deposition film.

Figure 9C:
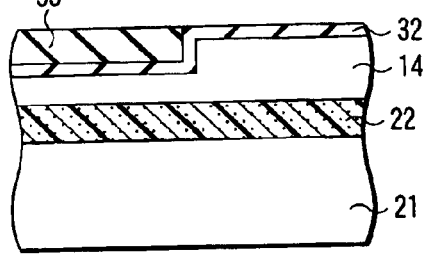

Subsequently, as shown in FIG. 9C, the top surface of the deposition film 33 is removed for flattening using an etching method, a CMP method, or the like. At this time, the deposition film 33 is removed until those areas of the insulating film 32 which are located on the convex parts of the semiconductor layer 14 are exposed. Subsequently, as described previously, the deposition film 33 is bonded to the handle wafer. Then, the separation layer 22 is destroyed to split the seed wafer 21.

In the method according to this embodiment, the top surface of the semiconductor layer 14 is flattened. Consequently, a sufficient adhesive strength is obtained when the top surface is bonded to the handle wafer.

In this embodiment, when the deposition film 33 is flattened, it may be flattened so that the deposition film 33 also remains on the convex parts of the semiconductor layer 14, rather than being removed until those areas of the surface of the insulating film 32 which are located on the convex parts of the semi-conductor layer 14 are exposed.

Furthermore, after the deposition film 33 has been flattened as shown in FIG. 9C, a new deposition film 34 may be deposited all over the top surface of the resulting structure. The deposition film 34 may be, for example, polycrystalline silicon, amorphous Si, a silicon oxide film ($SiO_2$), or a silicon nitride film (SiN).

(Fifth Embodiment)

Now, a method according to a fifth embodiment will be described with reference to FIG. 10.

When an SOI wafer having a surface pattern with concave and convex parts is bonded to another wafer as described previously, if a thick oxide film of about 100 nm is formed on the concave and convex surface as an insulating film under thin-film semiconductor areas, the underlying semiconductor layer may undergo a high stress to cause dislocation. Accordingly, the oxide film desirably has a thickness of 10 nm or less.

Thus, in a method according to the fifth embodiment, after the concave and convex surface of the semiconductor layer has been oxidized to form an oxide film of thickness 10 nm or less, another deposition film is formed on the surface of the oxide film to obtain a sufficient insulating film thickness.

Figure 10:
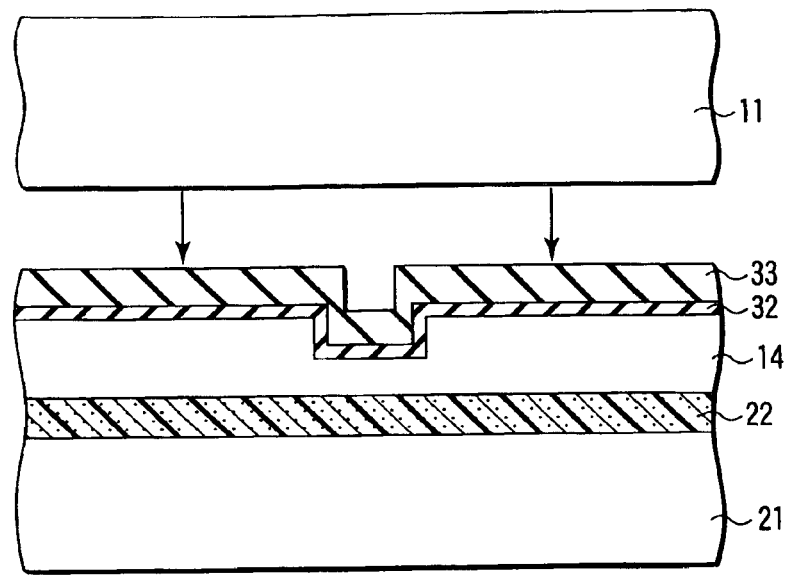
FIG. 10 is a sectional view showing some steps of a manufacturing method for a semiconductor device according to a fifth embodiment of the present invention.

Specifically, as shown in FIG. 10, the SOI wafer is provided which has the separation layer 22 and the semiconductor layer 14 with a uniform thickness both stacked on the seed wafer 21, composed of a silicon semiconductor substrate. Subsequently, the semi-conductor layer 14 is processed to form concave and convex parts on its surface. For this processing, as described previously, the semiconductor layer 14 may be formed so as to have a uniform film thickness and then selectively etched so as to be partly formed with convex parts. Alternatively, the semiconductor layer 14 may be formed so as to have a uniform film thickness and then selectively epitaxially grown so as to be partly formed with convex parts. Subsequently, the surface is thermally oxidized to form the insulating film 32 of thickness 10 nm or less.

Subsequently, a CVD method or the like is used to form, all over the surface of the resulting structure, a deposition film 33 composed of an arbitrary film, e.g., polycrystalline silicon, amorphous Si, a silicon oxide film ($SiO_2$), or a silicon nitride film (SiN). In this case, the deposition film is preferably composed of a material having nature similar to that of the underlying insulating film 32. For example, if the insulating film 32 is a thermal oxide film, the deposition film 33 may be a CVD oxide film.

Subsequently, the deposition film 33 is bonded to the handle wafer. The subsequent process is the same as that in the previously described embodiment. Its description is omitted.

The method according to this embodiment does not only produce effects similar to those of the method according to the second embodiment but also enables a reduction in the area of the convex parts on the surface of the semiconductor layer 14. Consequently, a sufficient adhesive strength is obtained when the deposition film 33 is obtained when the deposition film 33 is bonded to the handle wafer 11.

Figure 11A:
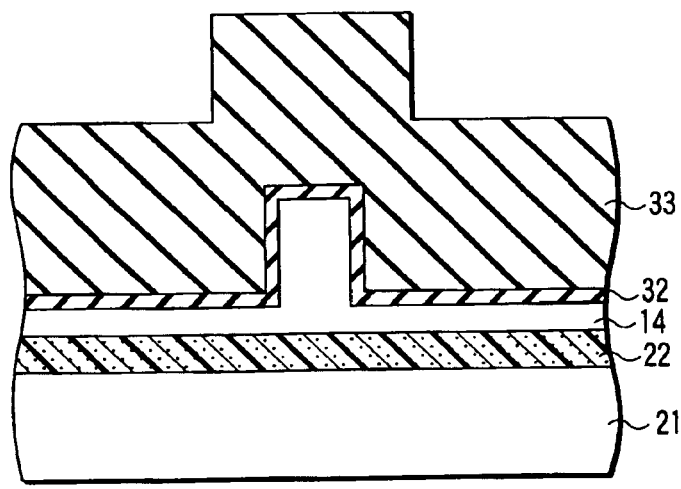
FIGS. 11A and 11B are sectional views showing some steps of a manufacturing method for a semiconductor device according to a variation of the fifth embodiment of the present invention.

If the convex parts present on the surface of the semiconductor layer 14 are small in area, when the deposition film 33 is formed on the insulating film 32 as shown in FIG. 11A, those part of the deposition film 33 project which are located on the respective convex parts of the semiconductor layer 14. Also in this case, a sufficient adhesive strength cannot be obtained.

Figure 11B:
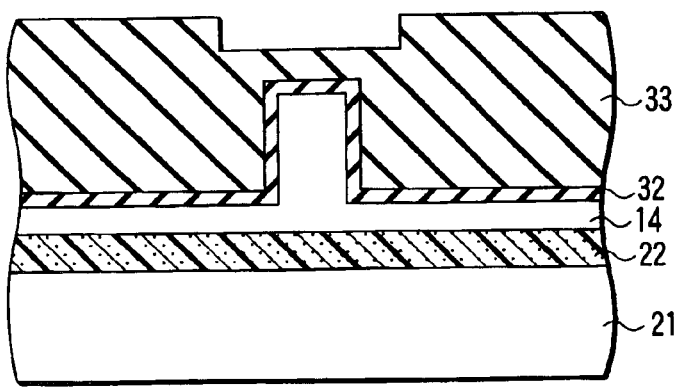

Therefore, in such a case, the projecting parts of the deposition film 33 are removed as shown in FIG. 11B before the deposition film 33 is bonded to the handle wafer 11. Then, a sufficient adhesive strength is obtained.

(Sixth Embodiment)

Now, a method according to a sixth embodiment will be described with reference to FIGS. 12A to 12D.

First, as shown in FIG. 12A, the SOI wafer 20 is provided which has the separation layer 22 and the semiconductor layer 14 with a uniform thickness both stacked on the seed wafer 21, composed of a silicon semiconductor substrate.

Then, as shown in FIG. 12B, the semiconductor layer 14 is selectively removed to form concave and convex parts.

For selective removal, the semiconductor layer 14 may be subjected to selective LOCOS oxidation and then removed or may be subjected to selective anode formation and then dug down by selective etching.

Thus, the thin-film semiconductor areas 15 and the thick-film semiconductor areas 16 are formed on the semiconductor layer 14. At this time, the LOCOS oxidation or selective anode formation process may be divided into several steps to form concave parts of different depths as shown in the figure so that the thin-film semiconductor areas 15 have different film thicknesses. Subsequently, the surface of the semi-conductor layer 14 is thermally oxidized to form an insulating film 32 of thickness 10 nm or less.

Then, as shown in FIG. 12C, the semiconductor layer 14 is bonded to the handle wafer 11, composed of a silicon semiconductor substrate.

Subsequently, the separation layer 22 is destroyed by the water jet technique if the SOI wafer 20 has been formed by the ELTRAN technique or by the smart cut method if the SOI wafer 20 has been formed by the UNIBOND technique. Thus, the seed wafer 21 is split to obtain such a structure as shown in FIG. 12D.

Also with the method according to this embodiment, the thin-film semiconductor area 15 and thick-film semiconductor area 16, which have different film thicknesses, can be formed in the semiconductor layer 14. Further, the top surface of the semiconductor layer 14 is flat. Accordingly, when elements are subsequently formed in the thin-film semiconductor areas 15 and the thick-film semiconductor areas 16, no steps are present on the surface of the substrate. This prevents a decrease in the yield associated with the formation of fine patterns as occurs in the prior art.

Further, since no BOX oxide films need to be formed inside the substrate, no crystal defects occur at the boundary parts between the respective thin-film semiconductor areas 15 and the corresponding thick-film semiconductor areas 16.

In this embodiment, the cavities 26 under the thin-film semiconductor areas 15 remain intact. However, the cavities 26 may be finally eliminated by forming another deposition film composed of an insulating film, a semiconductor film, a conductor film, or the like and then flattening the surface of this deposition film, after the step in FIG. 12B and before the step in FIG. 12C, as in the case with the above fourth embodiment.

(Seventh Embodiment)

Now, a method according to a seventh embodiment will be described with reference to FIGS. 13A to 13C.

In the previously described embodiments and variations, if concave parts are formed in the semiconductor layer 14, the original semiconductor 14 partly remains intact. However, this method may hinder the proper control of the film thickness of concave parts in the semiconductor layer 14 left as the thin-film semiconductor areas.

Thus, this embodiment allows the film thickness of each thin-film semiconductor area to be properly controlled by using a semiconductor layer different from the semiconductor layer 14 to form concave parts, i.e. thin-film semiconductor areas.

Figure 13A:
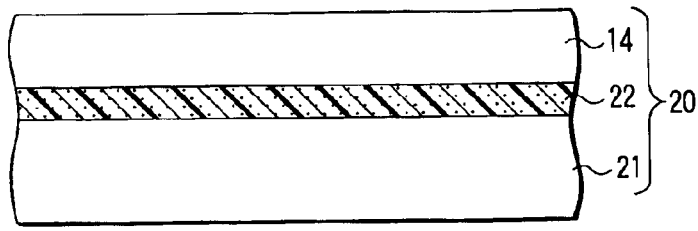
FIGS. 13A to 13C are sectional views showing a manufacturing method for a semiconductor device according to a seventh embodiment of the present invention in the order of steps of the method.

Fist, as shown in FIG. 13A, the SOI wafer 20 is provided which has the separation layer 22 and the semiconductor layer 14 with a uniform thickness both stacked on the seed wafer 21, composed of a silicon semiconductor substrate.

Figure 13B:
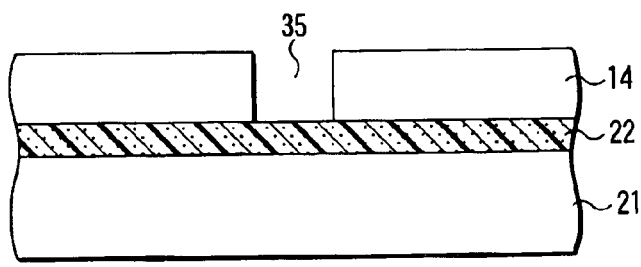
Figure 13C:
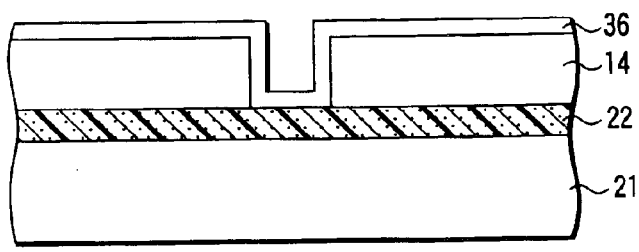

Then, as shown in FIG. 13B, the semiconductor layer 14 is selectively etched to form openings 35 reaching the separation layer 22.

Then, hydrogen annealing is carried out to improve the uniformity of the etching surface. Subsequently, as shown in FIG. 13C, a semiconductor layer 36 of a uniform thickness is deposited all over the etching surface by epitaxial growth. Thus, the original semiconductor layer 14 and the newly deposited semiconductor layer 36 cooperate in forming thick-film semiconductor areas. On the other hand, the semi-conductor layer 36 remaining in each opening 35 forms a thin-film semiconductor area.

Subsequently, as in the case with the fourth embodiment, the semiconductor layer 14 is bonded to the handle wafer as it is or after the concave and convex parts on the surface of the semiconductor layer 14 have been flattened. Furthermore, the separation layer 22 is destroyed to split the seed wafer 21.

This embodiment does not only produce effects similar to those of the second embodiment but also allows the thickness of each thin-film semiconductor area to be controlled more improperly. This is because the film thickness of the thin-film semiconductor area is determined by the epitaxially grown layer.

(Eighth Embodiment)

Now, a method according to an eighth embodiment will be described with reference to FIGS. 14A to 14F.

Figure 14A:
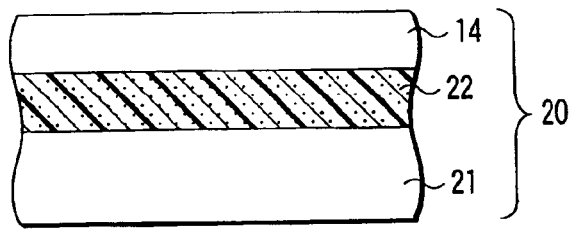
FIGS. 14A to 14F are sectional views showing a manufacturing method for a semiconductor device according to an eighth embodiment of the present invention in the order of steps of the method.

First, as shown in FIG. 14A, the SOI wafer 20 is provided which has the separation layer 22 and the semiconductor layer 14 with a uniform thickness both stacked on the seed wafer 21, composed of a silicon semiconductor substrate.

Figure 14B:
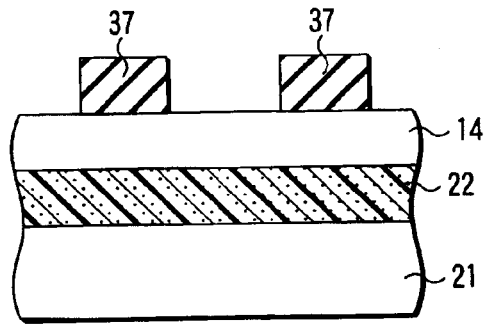

Then, as shown in FIG. 14B, the semiconductor layer 14 is selectively oxidized to form oxide films 37.

Figure 14E:
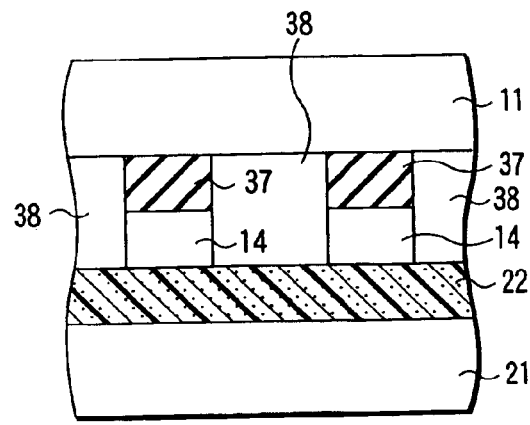
Figure 14C:
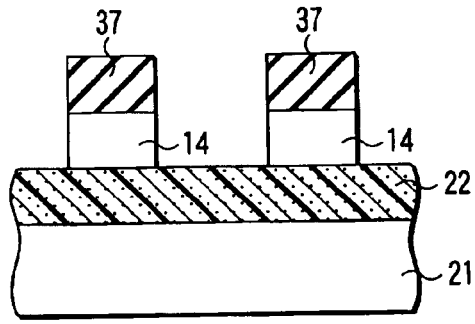

Then, as shown in FIG. 14C, the oxide films 37 are used as an etching mask to etch the semiconductor layer 14 selectively until the separation layer 22 is exposed. Subsequently, hydrogen annealing may be carried out to improve the uniformity of the etching surface. Then, as shown in FIG. 14D, the oxide film 37 is bonded to the handle wafer 11, composed of a silicon semiconductor substrate.

Subsequently, as shown in FIG. 14E, an epitaxial growth technique is used to bury monocrystalline silicon in the space between the handle wafer 11 and the separation layer 22 to form semiconductor layers 38.

Figure 14F:
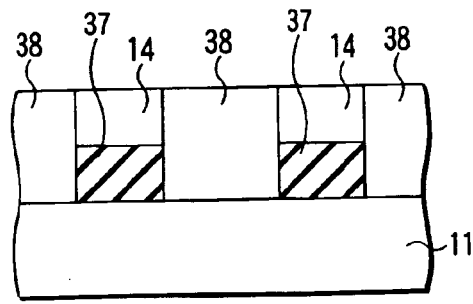
Figure 14D:
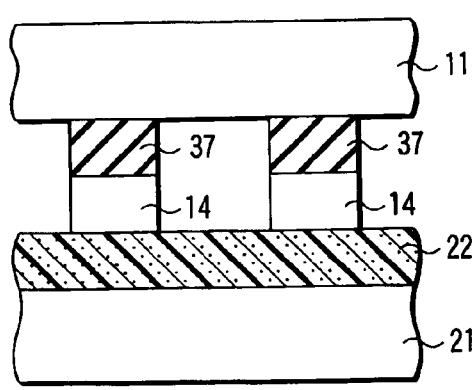

Subsequently, the separation layer 22 is destroyed to split the seed wafer 21 to obtain such a structure as shown in FIG. 14F.

In this case, thin-film semiconductor areas are composed of those parts of the semiconductor layer 14 which remain on the oxide films 37. Since the oxide films 37 are formed under the thin-film semiconductor areas, the latter constitute SOI areas. Consequently, a digital circuit composed of a thin-film SOI-MOSFET can be formed in each thin-film semiconductor area.

On the other hand, the thick-film semiconductor areas are composed of the semiconductor layers 38, formed by epitaxial growth. The thick-film semi-conductor areas are electrically connected to the handle wafer 11. Accordingly, each thick-film semiconductor area can be formed with an analog circuit composed of a MOSFET of a bulk structure to which a substrate potential is reliably provided.

Also in this embodiment, the thin-film semi-conductor area 15 and thick-film semiconductor area 16, which have different film thicknesses, can be formed on the handle wafer 11. Further, the top surfaces of the thin- and thick-film semiconductor areas are flush with each other and are flat. Accordingly, when elements are subsequently formed in the thin- and thick-film semiconductor areas, no steps are present on the surface of the substrate. This prevents a decrease in the yield associated with the formation of fine patterns as occurs in the prior art.

Further, since no BOX oxide films need to be formed inside the substrate, no crystal defects occur at the boundary parts between the respective thin-film semiconductor areas and the corresponding thick-film semiconductor areas.

Now, description will be given of an applied example of the present invention in which elements are formed using a wafer including a handle wafer bonded to another wafer as described above.

Figure 15:
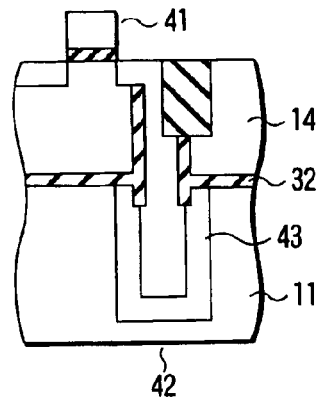
FIG. 15 is a sectional view of a semiconductor device according to an applied example of the present invention.

FIG. 15 shows a semiconductor device including a bonded wafer in which a MOSFET 41 for a DRAM memory cell and a trench capacitor 42 are formed. In this case, the bonded surface on which the insulating film 32 is formed is set to lie over a diffusion layer area 43 corresponding to a plate electrode of the trench capacitor 42. This prevents the degradation of element characteristics, in this case, the leakage characteristic of the trench capacitor 42 in spite of the presence of an interface in the bonded wafer.

Figure 16:
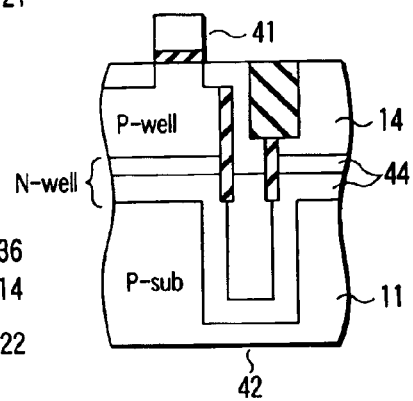
FIG. 16 is a sectional view of a semiconductor device according to an applied example of the present invention which is different from that in FIG. 15.

FIG. 16, like FIG. 15, shows a semiconductor device including a bonded wafer in which the MOSFET 41 for a DRAM memory cell and the trench capacitor 42 are formed. In this case, both bonded surfaces constitute N-well areas 44 that constitute a diffusion layer area corresponding to a plate electrode of the trench capacitor 42. This prevents the degradation of the element characteristics.

Figure 17:
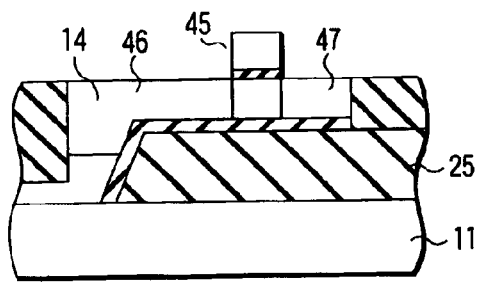
FIG. 17 is a sectional view of a semiconductor device according to an applied example of the present invention which is different from those in FIGS. 15 and 16.

FIG. 17 shows a semiconductor device including a bonded wafer in which a MOSFET is formed as an ESD element. In the interface between wafers, plane directions may deviate from each other even if the same materials are bonded to each other. As a result, amorphous state may be formed to degrade the quality of the interface compared to a normal monocrystalline substrate state. If the wafers are jointed together so that a depletion layer overlaps the interface, a junction leakage current may increase or a junction withstand voltage may decrease.

The semiconductor device in FIG. 17 positively utilizes the above characteristics of the interface. If a drain region 46 and a source region 47 of a MSOFET 45 are formed in the semiconductor layer 14 as an ESD element, the MOSFET 45 is formed so that the drain region 46 is located above the bonded surface. Thus, if a surge voltage is applied to the drain region 46, a depletion layer extending from the drain area overlaps the bonded surface. This allows the surge voltage to be discharged more properly.

A cavity may be formed in place of the oxide film 25 located under the semiconductor layer 14.

In the description of the above embodiments and variations, the handle wafer 11, the seed wafer 21, and the semiconductor layer 14 are each composed of semiconductor silicon (Si). However, in addition to Si, SiGe or GaAs may be used as a semiconductor material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a plurality of convex films provided at selected positions on the substrate;
   an insulating film provided so as to extend continuously over the plurality of convex films and a surface of the substrate;
   a semiconductor layer provided on the insulating film and composed of thin-film semiconductor areas located over the plurality of convex films and thick-film semiconductor areas each located between a pair of convex films and having a larger film thickness than the thin-film semiconductor areas, the semiconductor layer having a flat surface on its top surface; and
   a conductive layer provided in the insulating film at positions corresponding to the thick-film semiconductor areas to connect electrically the semiconductor layer and the substrate together.

2. The semiconductor device according to claim 1, wherein the plurality of convex films are composed of the same material as that of the conductor layer.

3. The semiconductor device according to claim 1, wherein the plurality of convex films and the semiconductor film are each a polycrystalline silicon film.

4. The semiconductor device according to claim 1, wherein the first and second semiconductor substrates and the semiconductor layer are composed of Si, SiGe, or GaAs.

5. A semiconductor device comprising:
   a semiconductor substrate;
   oxide films provided at selected positions on the substrate; and
   a semiconductor layer provided so that cavities are created over the respective oxide films and also created between the semiconductor layer and the substrate in areas in which the oxide film is not formed, the semiconductor layer being composed of thin-film semiconductor areas located over the respective oxide films and thick-film semiconductor areas which are the areas of the semiconductor layer other than the thin-film semiconductor areas and which have a larger film thickness than the thin-film semiconductor areas, the semiconductor layer having a flat surface on its top surface.

6. A semiconductor device comprising:
   a semiconductor substrate;
   a plurality of oxide films provided at selected positions on the substrate and having different thicknesses; and
   a semiconductor layer provided so as to extend continuously over the oxide films and the substrate and composed of a plurality of thin-film semiconductor areas located over the plurality of oxide films and having different film thicknesses and thick-film semiconductor areas located over the substrate and having a larger film thickness than the thin-film semiconductor areas, the semiconductor layer having a flat surface on its top surface.

7. A semiconductor device comprising:
   a semiconductor substrate;
   oxide films provided on the substrate create cavities between the oxide films and the substrate; and
   a semiconductor layer provided so as to extend continuously over the oxide films and the substrate and composed of thin-film semiconductor areas located over the respective oxide films and thick-film semiconductor areas located over the substrate and having a larger film thickness than the thin-film semiconductor areas, the semiconductor layer having a flat surface on its top surface.

* * * * *